United States Patent [19]

Tanaka

[11] Patent Number: 5,005,058
[45] Date of Patent: Apr. 2, 1991

[54] LIGHT-EMITTING DIODE WITH LIGHT-TRANSMISSIVE FILM

[75] Inventor: Yukio Tanaka, Yokohama, Japan

[73] Assignee: Eastman Kodak Company, Rochester, N.Y.

[21] Appl. No.: 576,890

[22] Filed: Sep. 4, 1990

[30] Foreign Application Priority Data

Mar. 19, 1990 [JP] Japan .................... 2-69197

[51] Int. Cl.⁵ .............................. H01L 33/00
[52] U.S. Cl. ........................ 357/17; 357/52; 357/54
[58] Field of Search ............... 357/17, 45, 52, 52 C, 357/54

[56] References Cited

U.S. PATENT DOCUMENTS

| | | | |
|---|---|---|---|
| 4,295,148 | 10/1981 | Marine et al. | 357/17 |
| 4,495,514 | 1/1985 | Lawrence et al. | 357/17 X |
| 4,570,172 | 2/1986 | Henry et al. | 357/17 |
| 4,680,602 | 7/1987 | Watanabe et al. | 357/17 |

FOREIGN PATENT DOCUMENTS

| | | | |
|---|---|---|---|
| 59-46071 | 3/1984 | Japan | 357/17 X |
| 60-74484 | 4/1985 | Japan | 357/17 X |
| 61-191084 | 8/1986 | Japan | 357/17 X |

Primary Examiner—William Mintel
Attorney, Agent, or Firm—Raymond L. Owens

[57] ABSTRACT

A light-emitting diode device having a thin film of silicon nitride or the like is selected so that the intensity of the emitted light can be maintained at a more or less constant level even when the temperature of the light-emitting section rises.

5 Claims, 3 Drawing Sheets

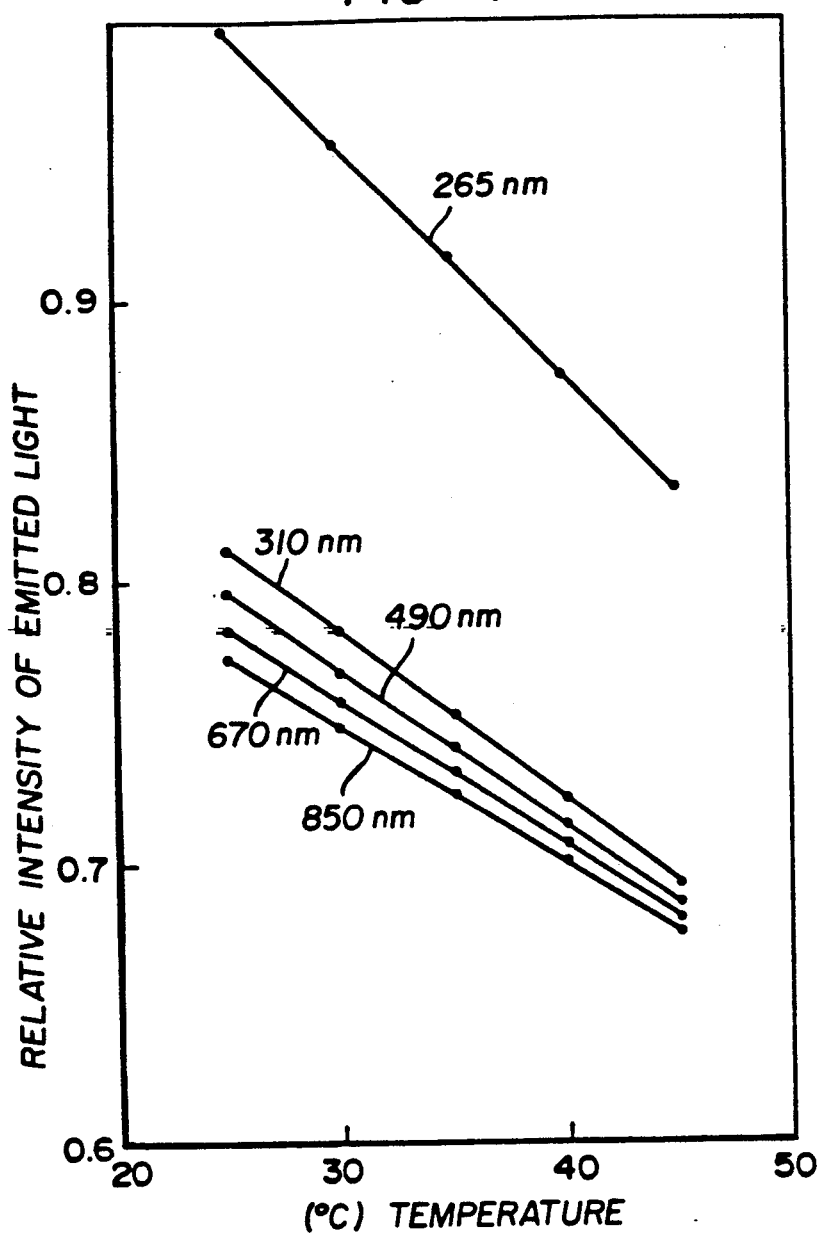

LIGHT-EMITTING DIODE WITH LIGHT-TRANSMISSIVE FILM

BACKGROUND OF THE INVENTION

1. Field of the Invention

The present invention relates to a light-emitting device, particularly to such a device constituted by a light-emitting diode or light-emitting diode array.

2. Description of the Prior Art

Light-emitting devices constituted of P-N junction light-emitting diodes are used in optical printers which use a beam of light to record information, in image and bar-code reading systems which utilize the intensity of reflected light, and in optical communications devices which utilize optical signals.

These light-emitting diodes are constituted as a junction of P and N type semiconductor material to form a light emitting section which is made to emit light of a prescribed wavelength by applying a forwardly-biased voltage across this P-N junction. Usually a thin film of silicon-nitride or the like is formed adjacent to the light-emitting section which serves to protect the light-emitting section while also allowing the external emission of the light produced by the light-emitting section. The thickness of the thin film is selected with the object of maximizing the externally-emitted amount of light produced by the device. The following equation shows how such a thickness value is determined.

$$d = (\lambda/4n) \cdot (2m+1) \quad (1)$$

where d is the thickness of the thin film, m is zero or a positive integer, $\lambda$ is the wavelength of the light emitted by the light-emitting diode at room temperature and n is the refractive index of the thin film.

Here, the transmittivity T of the thin film will be $$T = 4n_1 n^2 n_3 / (n_1 n_3 + n^2)^2 \quad (2)$$

where $n_1$ is the index of refraction of the light-emitting section adjacent to the thin film, that is, of the P and N semiconductor, and $n_3$ is the index of refraction of the air.

As described above, the diode emits light when a forward bias is applied across the P-N junction. Generally speaking, the energy efficiency of light-emitting diodes is low, no more than several percent, with most of the injected electrical energy being converted into heat in the light-emitting section. This heat raises the temperature of the light-emitting section, which reduces the light emission intensity and also shifts the center frequency of the emitted light towards the longer wavelength side of the spectrum.

FIG. 7 shows the spectral distribution obtained when using a P-N junction in which the P type semiconductor is a zinc-diffused $GaAs_{0.4}P_{0.6}$ layer and the N type semiconductor is a GaAsP layer which includes tellurium. The horizontal axis is the wavelength $\lambda$ of the emitted light (nm) and the vertical axis is the relative intensity of the light emitted by the light-emitting diode device and the transmittivity of the silicon-nitride layer at a maximum diode output of 1.0. At room temperature, i.e. 25° C., the center frequency of the emitted light is 660 nm, but as shown here, as the temperature of the light-emitting section rises, going to 30° C., 35° C., 40° C. and 45° C., the center frequency undergoes a shift to the longer wavelength side and there is a decrease in the relative intensity of the emitted light. With respect to FIG. 7, a value of 0.33 nm/°C., which is typical for a light-emitting diode, has been used for the wavelength of the emitted light and the temperature dependency of the intensity of the emitted light, and the distribution is Gaussian with a peak width at half height of 30 nm.

FIG. 7 also includes transmittivity T values of the silicon-nitride layer relative to the wavelength $\lambda$ of the emitted light, which shows that transmittivity T decreases with the increase in wavelength $\lambda$. If the index of refraction of the silicon-nitride layer is n=1.87, transmittivity T will be at a maximum when the index of refraction of the P and N semiconductor adjacent to the silicon-nitride layer is a typical $n_1 = 3.5$ and that of the air is $n_3 = 1.0$. Based on the use of equation (1) to determine the thickness d of the silicon-nitride layer to obtain the maximum transmission of light emitted by the light-emitting section, a thickness of d=265 nm is used, obtained using the values m=1, $\lambda$=660 nm and n=1.87.

Thus, a drawback with conventional light-emitting diode devices is that the intensity of the emitted light is reduced by a rise in the temperature of the light-emitting section, the resultant lengthening of the wavelength spectrum tends to produce a drop in the transmittivity of the silicon-nitride thin-film layer, sharply reducing the intensity of the emitted light.

When such a light-emitting diode is used as the light source in an optical printer, image reader or other such optical communication apparatus, this decrease in light intensity degrades the image quality, increases the read-error rate and produces a deterioration of the signal-to-noise ratio.

SUMMARY OF THE INVENTION

In view of the drawbacks of the conventional arrangement, an object of the present invention is to provide a light-emitting diode device in which the intensity of the emitted light can be maintained at a more or less constant level even when the temperature of the light-emitting section rises.

This object is attained in the light-emitting diode device according to the present invention by an arrangement whereby an increase in the wavelength of the emitted light is accompanied by an increase in the transmittivity of the thin film.

This object is also attained by an arrangement whereby the rate of change in the transmittivity T of the thin film relative to the wavelength $\lambda$ of the emitted light satisfies $dT/d\lambda > 10^{-3}(nm^{-1})$.

This object is also attained by a light-emitting diode device in which the thickness d of the thin film is $$(2m+1) + \alpha < 4nd/\lambda < 2(m+1) - \beta$$

where m is zero or a positive integer, n is the refractive index of the silicon nitride layer, $\lambda$ is the wavelength of the emitted light, $\alpha$ is zero or a positive constant, and $\beta$ is zero or a positive constant, whereby an increase in the wavelength of the emitted light is accompanied by an increase in the transmittivity of the thin film.

The object is further attained by using values for the $\alpha$ and $\beta$ of FIG. 3 whereby the change in the transmittivity T of the thin film at an emitted-light wavelength $\lambda$ satisfies $dT/d\lambda > 10^{-3}(nm^{-1})$.

With the light-emitting diode device arranged thus according to the present invention, an increase in the wavelength of the emitted light is accompanied by a corresponding rise in the transmittivity of the thin film, which enables the intensity of the emitted light to be kept at a more or less constant level even when a rise in the temperature of the light-emitting section shifts the wavelength λ of the emitted light towards the longer wavelength side.

With the light-emitting diode device of this invention light emitted by the light-emitting section constituted by a P-N junction is reflected at the interface between the semiconductor and the thin film and at the interface between the thin film and the air. This gives rise to mutual interference between the light reflected at the two interfaces, whereby the overall thin-film transmittivity changes in accordance with the wavelength of the emitted light. Thus, the transmittivity T of the thin film becomes $$T = (r_{12}^2 - 1)(r_{23}^2 - 1)/\{(r_{12}r_{23}+1)^2 - 4r_{12}r_{23}\sin^2\Phi\} \quad (4)$$

Here, $r_{12}$ is the reflection amplitude at the interface between the semiconductor and the thin film when the interference effect is not taken into account, $r_{23}$ is the reflection amplitude at the interface between the thin film and the air when the interference effect is not taken into account and $\Phi$ is the phase differential factor of the light within the thin film, which is $$\Phi = 2\pi nd/\lambda \quad (5)$$

when the incidence of the light is perpendicular to the thin film. From equation (4), the change $dT/d\lambda$ in the transmittivity T of the thin film with respect to the wavelength of the emitted light is $$dT/d\lambda = -\{4(r_{12}^2-1)(r_{23}^2-1)r_{12}r_{23}(2\pi nd/\lambda^2)\sin(2\Phi)\}/\{(r_{12}r_{23}+1)^2 - 4r_{12}r_{23}\sin^2\Phi\}^2 \quad (6)$$

From this equation it is clear that when thin-film thickness d satisfies $(2m+1) < 4nd/\lambda < 2(m+1)$, $dT/d\lambda$ will be positive. This therefore indicates that the transmittivity of a thin film with thickness d within this range will increase with the increase in the wavelength of the emitted light from the light-emitting section.

Since the transmittivity of the thin film increases with the increase in the wavelength of the emitted light caused by an increase in the temperature of the light-emitting section, even should the intensity of the emitted light from the light-emitting section show a decrease, the extent of such a decrease will be less than the corresponding decrease exhibited in the case of a conventional light-emitting diode.

Moreover, by using zero or a suitable positive integer for the α and β and setting the thickness d of the thin film to within the range $(2m+1)+\alpha < 4nd/\lambda < 2(m+1)-\beta$, if $dT/d\lambda > 10^{-3}(\text{nm}^{-1})$ the transmittivity of the thin film can be markedly increased as the wavelength of the emitted light increases, further suppressing the decrease in the intensity of the light which has passed through the thin film.

Further features of the invention, its nature and various advantages will be more apparent from the accompanying drawings and following detailed description of the invention.

BRIEF DESCRIPTION OF THE DRAWINGS

FIGS. 2 to 4 are graphs showing the relationship between the temperature of the light-emitting section of the light-emitting diode device of the invention and the intensity of the emitted light;

FIG. 5 is a table for explaining the decrease in the intensity of the emitted light and the change $dT/d\lambda$ in transmittivity T;

DETAILED DESCRIPTION OF THE INVENTION

Figure 1:
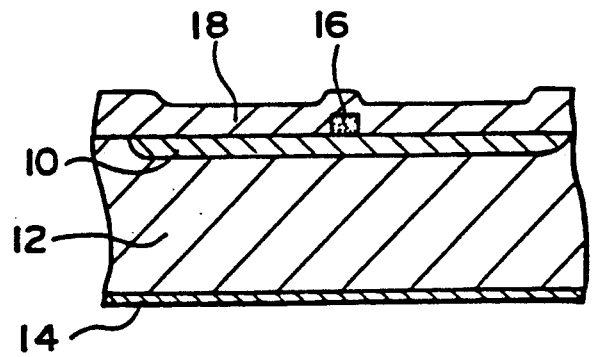
FIG. 1 is a cross-sectional view of a first embodiment of a light-emitting diode device according to the present invention.

FIG. 1 is a cross-sectional view of a preferred embodiment of the light-emitting diode device according to the present invention. The light-emitting section is a P-N junction in which the P type semiconductor is a zinc-diffused $GaAs_{0.4}P_{0.6}$ layer 10 and the N type semiconductor is a GaAsP layer 12 which includes tellurium. A positive electrode 16 is formed on the upper surface of the P type $GaAs_{0.4}P_{0.6}$ layer 10 and a negative electrode 14 on the lower surface of the N type GaAsP layer 12. These electrodes are used to apply a forward bias to the P-N junction to cause the light-emitting section to emit light of a prescribed wavelength.

A silicon nitride layer 18 is formed adjacent to the light-emitting section as a thin film using a technique such as plasma CVD or the like. This thin-film silicon nitride layer 18 is transparent to light emitted by the light-emitting section.

In accordance with equation (3), the thickness d of the silicon nitride layer 18 is established as follows:

$$(2m+1)+\alpha < 4nd/\lambda < 2(m+1)-\beta$$

where m is zero or a positive integer, n is the refractive index of the silicon nitride layer, λ is the wavelength of the emitted light, α is zero or a positive constant, and β is zero or a positive constant. If for example m=1, the wavelength of the emitted light λ is 660 nm and n=1.87, then the range of silicon nitride layer thickness d will be 265 nm < d < 530 nm.

Concerning the layer thickness d, in equation (6) $dT/d\lambda > 0$. This indicates that as the wavelength λ increases, the transmittivity T of the silicon nitride layer also increases.

Figure 2:
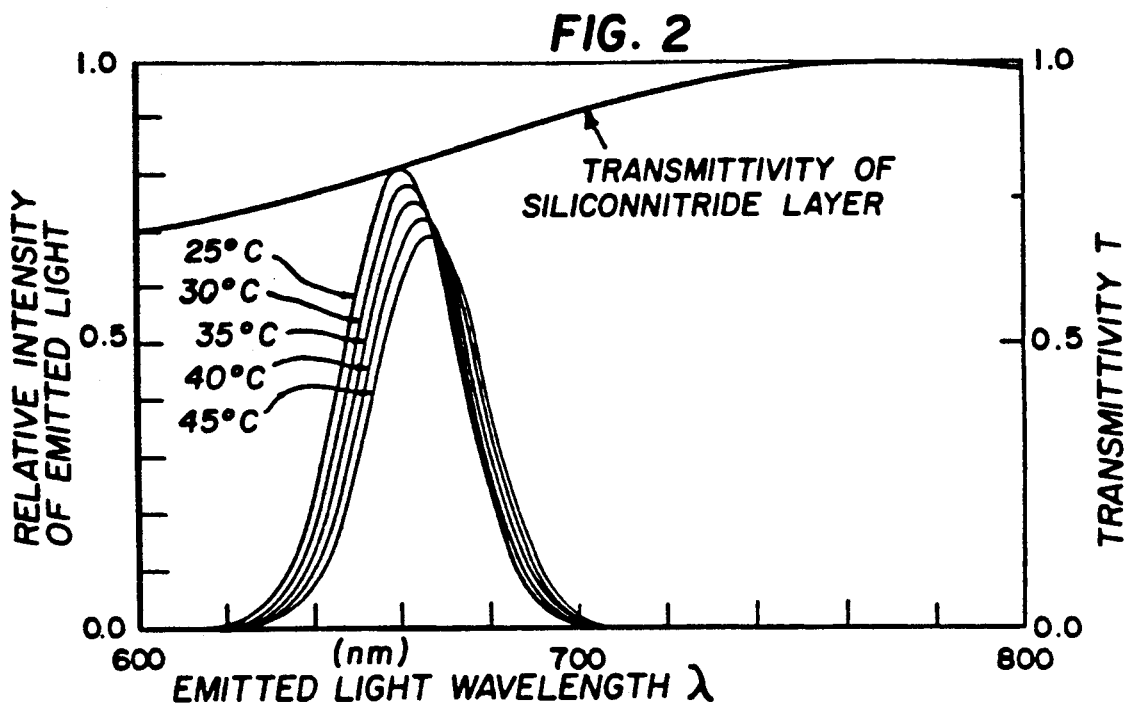

FIG. 2 shows the transmittivity of a silicon nitride layer of a thickness d=310 nm, satisfying the range 265 nm < d < 530 nm. Here, the index of refraction of the P type $GaAs_{0.4}P_{0.6}$ layer 10 is assumed to be 3.5, that of the silicon nitride layer 18 is assumed to be 1.87, and that of air is assumed to be 1.0. The wavelength λ of the light emitted by the light-emitting section is 660 nm when the light-emitting diode is at a room temperature of 25° C. FIG. 2 shows the spectral distribution produced by the transmission of the light through the 310 nm-thick silicon nitride layer 18. The effect of elevating the temperature of the light-emitting section to 45° C. is to lengthen the wavelength of the emitted light, which raises the transmittivity of the silicon nitride layer 18 to around 667 nm and producing a slightly reduced spectral distribution compared to the intensity of the emitted light at 25° C., as shown in the FIG.

Figure 3:
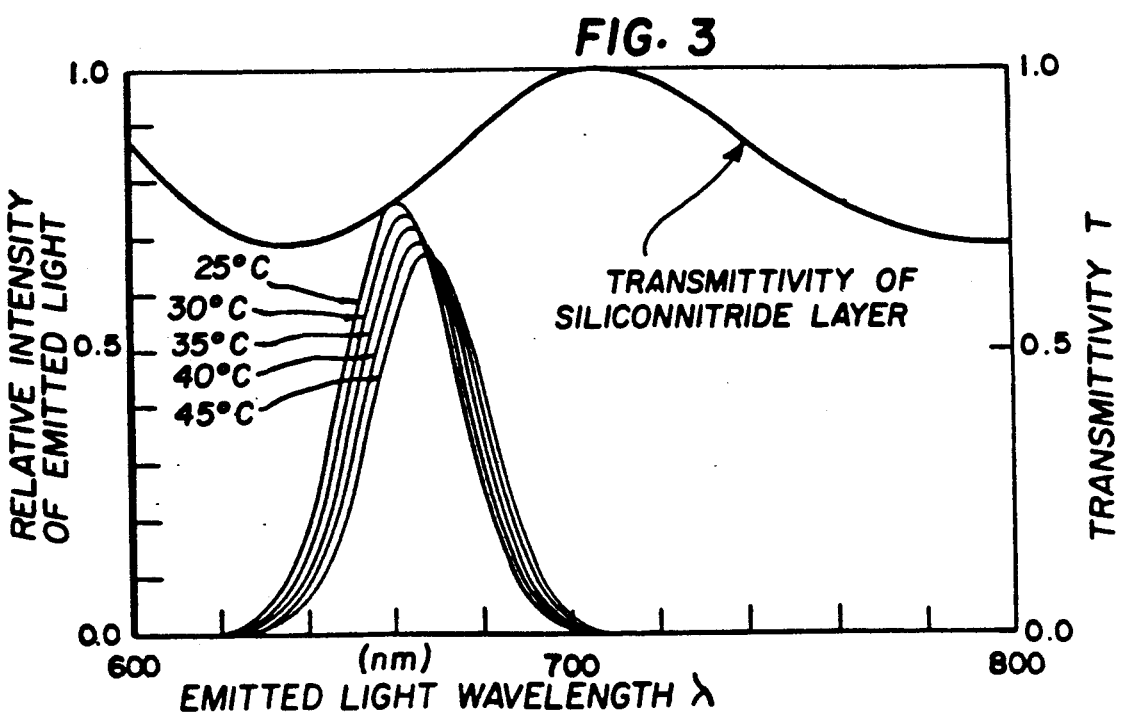
Figure 7:
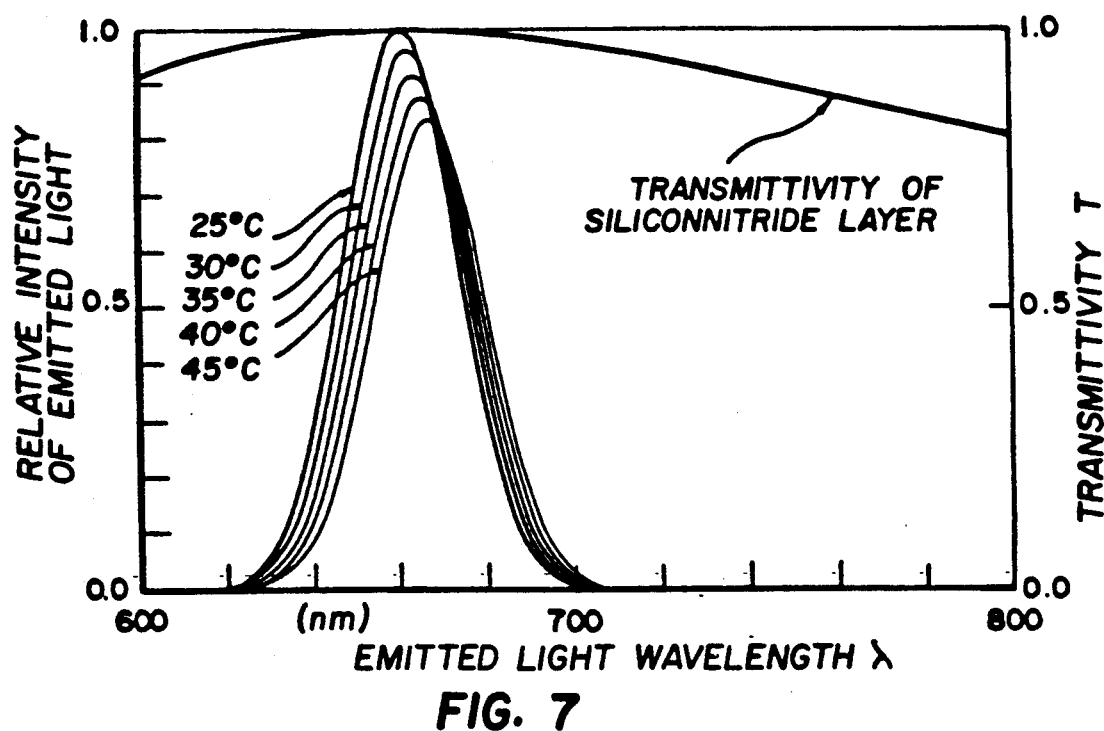
FIG. 7 is a graph showing the relationship between the temperature of the light-emitting section of a conventional light-emitting diode device and the intensity of the emitted light.

FIG. 3 shows the transmittivity of a silicon nitride layer 18 having a thickness of 858 nm which satisfies equation (3) when m=4, wavelength λ=660 nm and n=1.87. In this case too, if the 25° C. temperature of the light-emitting section is raised to 45° C., lengthening the wavelength of the emitted light, the transmittivity of the silicon nitride layer 18 increases and, as shown by FIG. 7, this reduces the temperature-based decrease in the intensity of the emitted light, compared with a conventional light-emitting diode device.

FIG. 4 shows the intensity of the emitted light plotted against light-emitting section temperature for thicknesses d of 310 nm, 490 nm, 670 nm and 810 nm which satisfy equation (3), when the intensity of the light transmitted by the silicon nitride layer 18 is m=1, 2, 3, and 4, respectively. For the purpose of comparison, FIG. 4 also includes a curve of the light intensity plotted against the temperature of the light-emitting diode in the case of a silicon nitride layer having a conventional thickness satisfying equation (1). FIG. 5 was produced on the basis of the plotted results of FIG. 4 and shows, for each thickness, the rate of decrease (%/°C.) in the intensity of the emitted light and the rate of change $dT/d\lambda$ in transmittivity T at the light emission wavelength $\lambda$ of 660 nm at a room temperature of 25° C.

As can be seen from FIGS. 4 and 5, compared to the rate of decrease of $-0.82\%/°C$. in the intensity of the light emitted by a conventional light-emitting diode device in which the thickness d of the silicon nitride layer 18 is 265 nm, with the thicknesses of the present embodiment, i.e. 310 nm, 490 nm, 670 nm and 850 nm the corresponding rates of decrease are lower, being $-0.6\%/°$ C., $-0.54/°C.$, $-0.52\%/°C.$ and $-0.49\%/°C$. This is because compared to the 0.0 rate of change $dT/d\lambda$ in transmittivity T relative to the wavelength $\lambda$ of the emitted light in the case of the conventional light-emitting diode device, the corresponding values of $2.4\times10^{-3}$, $3.6\times10^{-3}$, $4.6\times10^{-3}$ and $5.4\times10^{-3}$ in the case of the present embodiment are all large. Thus, in this embodiment, by setting the thickness of the silicon nitride thin-film layer to within a range in which an increase in the wavelength $\lambda$ of the emitted light is accompanied by an increase in the transmittivity T of the layer, it becomes possible to avoid a decrease in the intensity of the emitted light brought about by an increase in the wavelength of the emitted light caused by a rise in the temperature of the light-emitting section.

Although this embodiment has been described with reference to a silicon nitride thin-film layer, the said layer is not limited thereto but may instead be formed of other substances including $SiO_2$, $Si_2O_3$, $ZnO$, $CeO_2$, $ZrO_2$, $TiO_2$, $PbO$, $ZnSe$, $CdS$ and $ZnS$.

Figure 6:
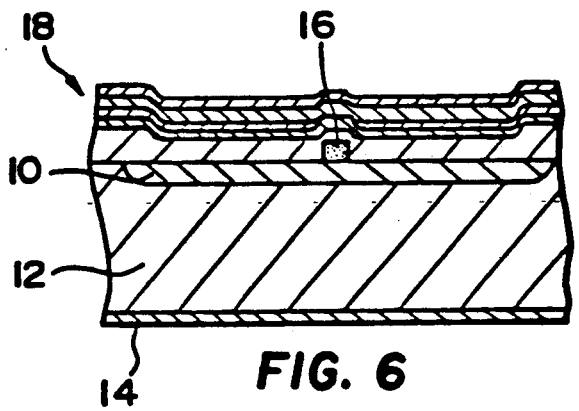
FIG. 6 is a cross-sectional view of another embodiment of the light-emitting diode device.

Also, although in this embodiment a single thin-film layer is used, an arrangement such as the one illustrated in FIG. 6 may be used in which there are a multiplicity of thin films with different indexes of refraction and thicknesses. With such an arrangement, if the index of refraction of each layer is $n_1$, $n_2$, $n_3$, . . . , $n_N$ and the thickness of each layer, is $d_1$, $d_2$, $d_3$, . . . , $d_N$ the transmittivity T of this N layer will be determined by the mutual interference in the N layer of light reflected or transmitted at the boundaries between layers, but the same effect can be obtained if the transmittivity at this time increases together with the increase in the wavelength of the emitted light.

The mixture ratio of the $GaAs_{0.4}P_{0.6}$ semiconductor substances used to constitute the P and N layers may be set arbitrarily as required. Furthermore, other compound semiconductors may be used such as, for example, GaAs, GaAlAs, GaP and InGaP.

Although the invention has been described in terms of a light-emitting diode device which is a single light-emitting diode, it is to be understood that it is also applicable to an array of light-emitting diodes.

Thus, as described above, as with the light-emitting diode according to the present invention it is possible to prevent an increase in the temperature of the light-emitting section being accompanied by a decrease in the intensity of the emitted light, the light intensity can be maintained more or less constant, so that using it as the light source of an optical printer or image reader apparatus results in high image quality and read accuracy.

The invention has been described in detail with particular reference to certain preferred embodiments thereof, but it will be understood that variations and modifications can be effected within the spirit and scope of the invention.

What is claimed is:

1. A light-emitting diode comprised of a light-emitting section constituted by a P-N junction and a thin film formed adjacent to the light-emitting section and through which light produced in the light-emitting section is transmitted to the outside, the thin film being formed of a material wherein the transmittivity of the thin film increases as the wavelength of the emitted light increases.

2. The light-emitting diode according to claim 1 wherein the rate of change in the transmittivity T of the thin film relative to the wavelength $\lambda$ of the emitted light satisfies $dT/d\lambda > 10^{-3}(nm^{-1})$.

3. A light-emitting diode comprised of a light-emitting section constituted by a P-N junction and a thin film formed adjacent to the light-emitting section and through which light produced in the light-emitting section is transmitted to the outside, wherein the thickness d of the thin film is $(2m+1)+\alpha < 4nd/\lambda < 2(m+1)-\beta$, where m is zero or a positive integer, n is the refractive index of the thin film, $\beta$ is the wavelength of the emitted light, $\alpha$ is zero or a positive constant and $\beta$ is zero or a positive constant, the thin film being formed of a material wherein an increase in the wavelength of the emitted light is accompanied by an increase in the transmittivity of the thin film.

4. The light-emitting diode according to claim 3 wherein $\alpha$ and $\beta$ are selected so that the change in transmittivity T of the thin film at an emitted-light wavelength $\lambda$ satisfies $dT/d\lambda > 10^{-3}(nm^{-1})$.

5. The light-emitting diode of claim 4 wherein the thin film is silicon nitride.

* * * * *